(12) United States Patent
Guillemain et al.

(10) Patent No.: US 6,181,750 B1
(45) Date of Patent: Jan. 30, 2001

(54) APPARATUS FOR ESTIMATING THE FREQUENCY DIFFERENCE EXISTING BETWEEN THE CARRIER FREQUENCY OF A DIGITAL SIGNAL AND THE FREQUENCY OF A RECEIVER LOCAL OSCILLATOR

(75) Inventors: Christian Guillemain, Sannois; Abdelkrim Ferrad, Aubervilliers, both of (FR)

(73) Assignee: Alcatel, Paris (FR)

(*) Notice: Under 35 U.S.C. 154(b), the term of this patent shall be extended for 0 days.

(21) Appl. No.: 08/998,811

(22) Filed: Dec. 29, 1997

(30) Foreign Application Priority Data

Dec. 30, 1996 (FR) .................................................. 96 16195

(51) Int. Cl.[7] .............................. H04L 27/14; H04L 27/22
(52) U.S. Cl. ........................... 375/326; 329/307; 329/304
(58) Field of Search ..................................... 375/326, 324, 375/327, 344; 329/304, 306, 307, 308

(56) References Cited

U.S. PATENT DOCUMENTS

| | | | |
|---|---|---|---|
| 5,077,531 | 12/1991 | Takeuchi et al. | 329/304 |
| 5,103,431 | 4/1992 | Freeman et al. | 367/135 |
| 5,272,446 | * 12/1993 | Chalmers et al. | 329/304 |
| 5,995,483 | * 11/1999 | Marchok et al. | 370/207 |

* cited by examiner

*Primary Examiner*—Chi H. Pham
*Assistant Examiner*—Khai Tran
(74) *Attorney, Agent, or Firm*—Sughrue, Mion, Zinn, Macpeak & Seas, PLLC

(57) ABSTRACT

An apparatus estimates the frequency difference existing between the carrier frequency of a received digital signal and the frequency of a signal from a local oscillator contained in a receiver of the received signal. The receiver performs quadrature demodulation on the received signal. The apparatus includes a detector that detects the noise level received in the band of the receive filters, a processor for computing discrete Fourier transforms on the received signal transposed into baseband, a summer for summing the energy levels detected on either side of the center frequency of the receive filters, a subtractor for subtracting the noise level from the energy bands, and a comparator for comparing the resultant energy levels and delivering an estimate $\epsilon$ of the frequency difference.

10 Claims, 3 Drawing Sheets

APPARATUS FOR ESTIMATING THE FREQUENCY DIFFERENCE EXISTING BETWEEN THE CARRIER FREQUENCY OF A DIGITAL SIGNAL AND THE FREQUENCY OF A RECEIVER LOCAL OSCILLATOR

The invention relates to digital signal transmission, and more precisely to apparatus for estimating the frequency difference existing between the carrier frequency of a digital signal received by a receiver, and the frequency of the output signal of a local oscillator contained in the receiver and serving to demodulate the received signal or at least to transpose it into intermediate frequency.

BACKGROUND OF THE INVENTION

The invention is particularly applicable to satellite signal transmission in which, in particular, the Doppler effect, satellite drift, and the instability of the frequency transposition equipment impart frequency shifts to the received signal. At a ground station receiving the signal from the satellite, a rotation of the constellation is observed after the received signal has been transposed into baseband, and this does not enable the received signal to be sampled at the instants when the eye diagram is at its most open.

FIG. 1 is a block diagram of a digital signal receiver including an estimator for estimating the frequency difference existing between the carrier frequency of a received digital signal and the frequency of a receive local oscillator.

The receiver shown in FIG. 1 includes a direct-conversion quadrature demodulator to which the received signal, referenced SR, is applied. More precisely, the signal SR is applied to two mixers 10, 11 also receiving respective demodulation signals from a local oscillator 12, one of the mixers (10) receiving the demodulation signal via a 90° phase-shifter referenced 13. The mixers 10 and 11 deliver baseband signals to respective analog-to-digital converters (ADC) 14, 15 followed by receive filters 16, 17 that are conventionally Nyquist root band-pass pass filters (complex Nyquist filters). The filters 16 and 17 reject adjacent channels outside the band of the modulated signal SR and deliver respective trains I and Q respectively representing the in-phase component and the quadrature component of the modulated signal SR. Each received symbol is encoded over K samples (for example, K is equal to 4). The trains I and Q are applied to an estimator 18 serving to determine the frequency difference between the signal SR and the output signal of the local oscillator 12. Said frequency difference is referenced $\epsilon$ and is applied to the local oscillator 12 so as to perform automatic frequency control.

The estimator 18 operates conventionally using the Alberty algorithm. The drawback with that algorithm is that it does not work when interference is present for frequency shifts greater than Ds/4, where Ds is the symbol rate. In satellite transmission, such interference is constituted by the channels adjacent to the demodulated channel. Whenever one of the adjacent channels enters the band of a receive filter at ±Ds/2, the estimator 18 locks onto the adjacent channel and the frequency difference can no longer be measured. As a result the expected signal is lost.

SUMMARY OF THE INVENTION

A particular object of the invention is to remedy these drawbacks.

More precisely, one of the objects of the invention is to provide apparatus for estimating the frequency difference existing between the carrier frequency of a received digital signal and the frequency of a local oscillator contained in a receiver of the received signal, the frequency estimation apparatus working in a wider band than the Alberty algorithm, and being less sensitive than that algorithm to the presence of interference.

This object, as well as others that appear below, is achieved by means of apparatus for estimating the frequency difference existing between the carrier frequency of a received digital signal and the frequency of a signal from a local oscillator contained in a receiver of the received signal, the receiver performing quadrature demodulation on the received signal, the apparatus comprising:

detector means for detecting the noise level received in the receive filters bands;

computing means for computing discrete Fourier transforms on the received signal transposed into baseband;

summing means for summing the energy levels detected on either side of the receive filter center frequencies;

subtractor means for subtracting the noise level from the energy bands; and comparator means for comparing the resulting energy levels, the comparator means delivering an estimate of the frequency difference.

Such an estimator offers the advantage of working for frequency shifts less than Ds/2 in the absence of interference.

Advantageously, the comparator means are means for computing the ratio of the resulting energy levels.

The apparatus of the invention preferably includes means for detecting a frequency shift greater than Ds/4, where Ds is the symbol rate.

These means for detecting a frequency shift greater than Ds/4 advantageously compare the energy level of the midpoint (pm) of the spectrum obtained by means of the computing means with the energy levels of two points situated immediately below the −3 dB energy levels of the spectrum, and they cause the frequency of the local oscillator to be shifted by ±Ds/4 when one of the two energy levels is greater than the energy level of the midpoint.

The invention also provides a digital signal receiver including such estimation apparatus.

BRIEF DESCRIPTION OF THE DRAWINGS

Other characteristics and advantages of the invention appear on reading the following description of a preferred embodiment given by way of non-limiting example, and with reference to the accompanying drawings, in which.

DETAILED DESCRIPTION OF THE INVENTION

Figure 1:
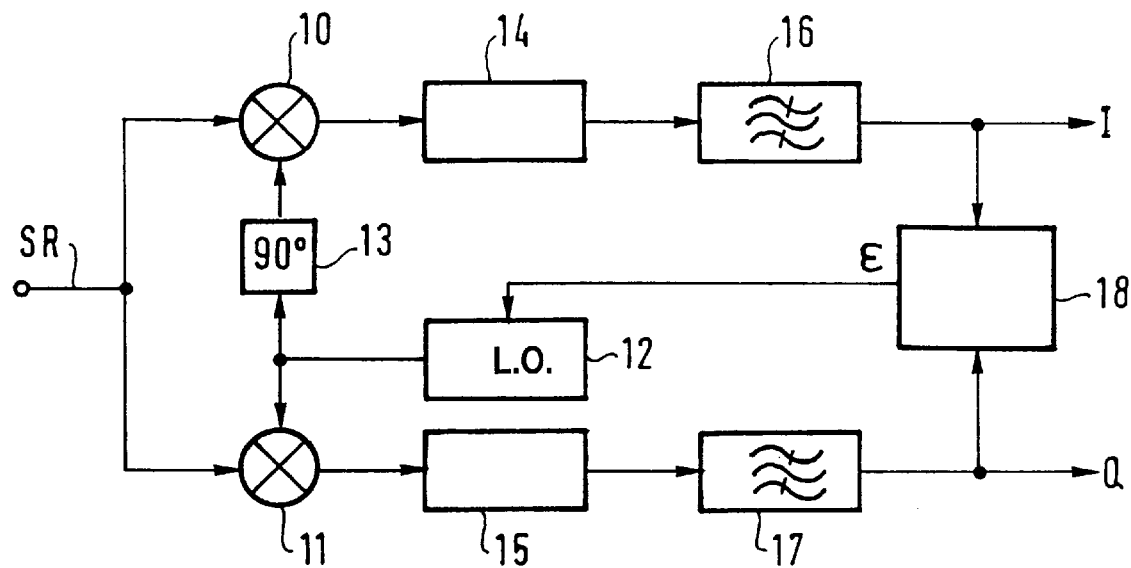
FIG. 1 is a block diagram of a known receiver of digital signals, the receiver containing an estimator for estimating the frequency difference existing between the carrier frequency of a received digital signal and the frequency of a receive local oscillator.

FIG. 1 is described above with reference to the state of the art.

Figure 2:
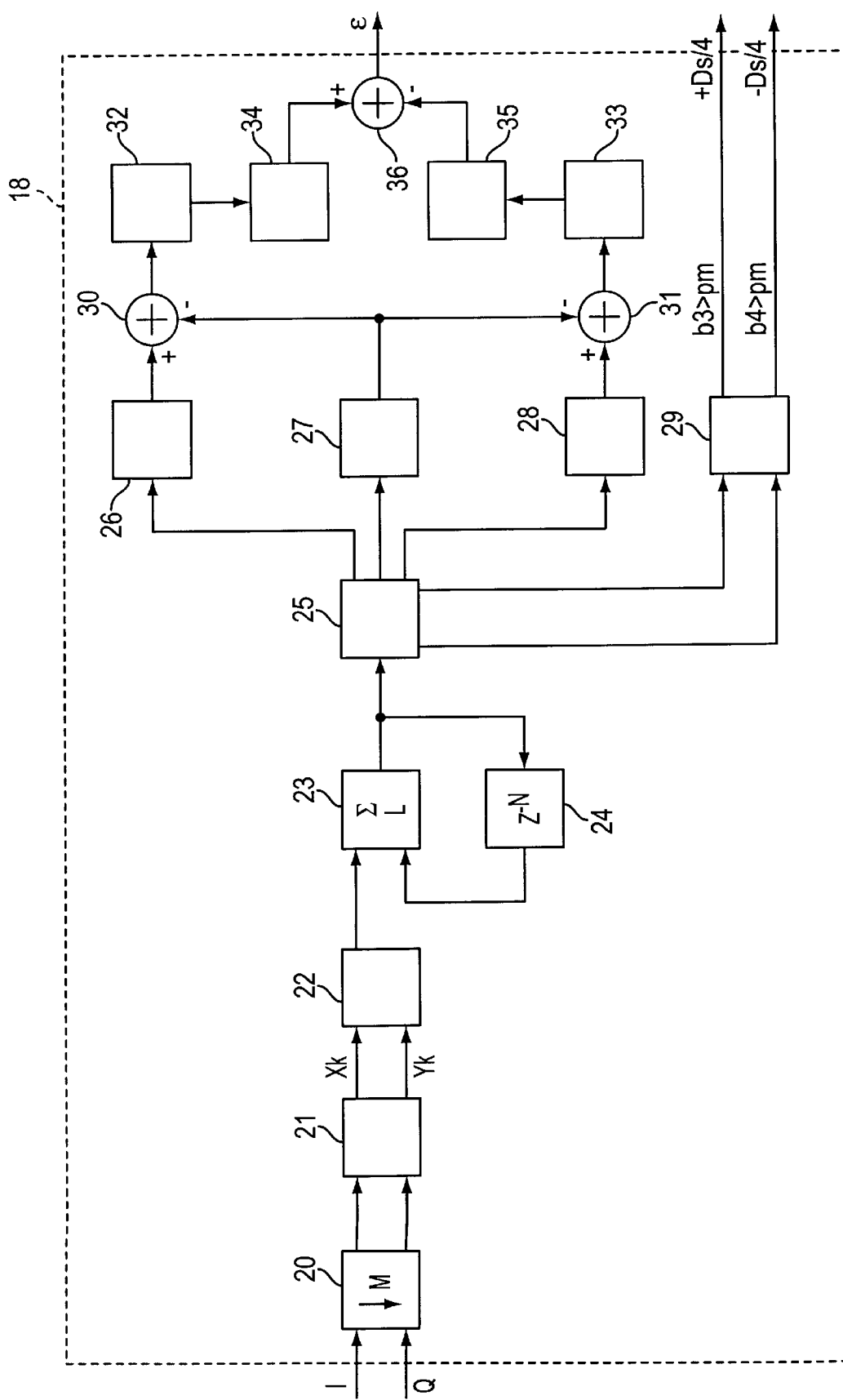
FIG. 2 is a block diagram of an estimator of the present invention for estimating such a frequency difference.

FIG. 2 is a block diagram of an estimator of the present invention for estimating a frequency difference.

The baseband trains I and Q are optionally applied to a decimator 20 for decimating the received bits by a factor M. The use of such an optional decimator 20 depends on whether the receiver has a multi-rate capability. At least four samples per symbol are available at the output of the decimator 20. The decimated trains are applied to means 21 for computing discrete Fourier transforms over N Fast Fourier Transform (FFT) points, the means delivering signals $X_k$ and $Y_k$ representing the amplitudes of the computed FFT points. These signals are applied to a unit 22 for computing the squares of the moduli of the amplitudes $X_k$ and $Y_k$. The unit 22 thus outputs vectors of value $X_k^2 + Y_k^2$. Each of the vectors is constituted by N FFT points. A number L of successive vectors are summed in a summing circuit 23 co-operating with a shift unit 24. The purpose of this summing is to smooth the spectrum and thus to attenuate the variance of the N FFT points taken separately.

Figure 3:
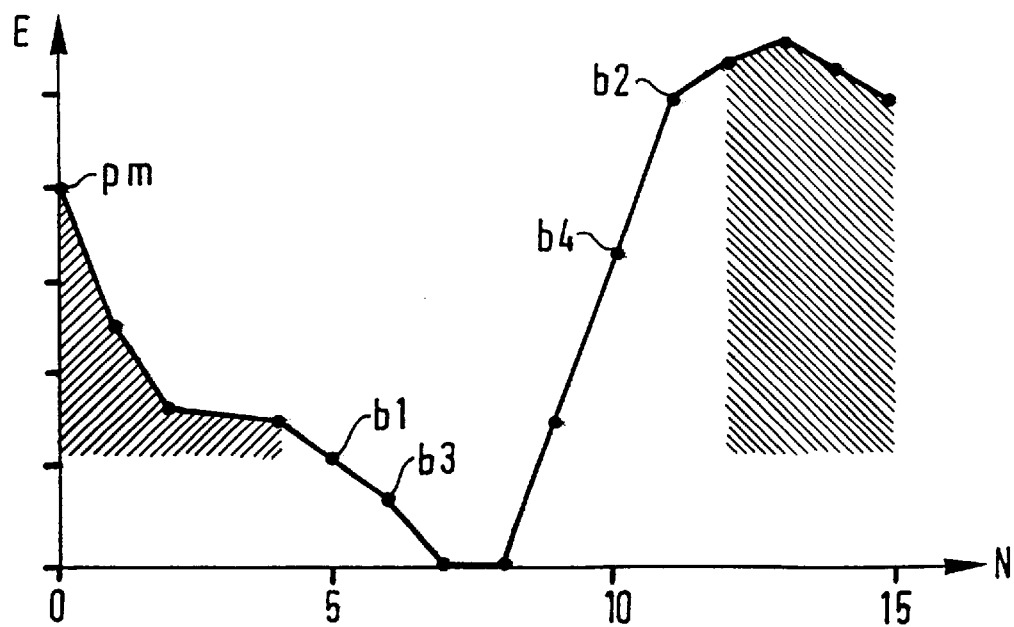
FIG. 3 shows a spectrum over N=16 Fast Fourier Transform (FFT) points obtained after smoothing over L=1000 consecutive FFT vectors performed on the received signal.

FIG. 3 shows a spectrum over N=16 FFT points obtained after smoothing over L=1000 FFT vectors. The Eb/No ratio is equal to 3 and the frequency shift is equal to Ds/2 (the most unfavorable case because one half of the band of an adjacent channel enters into the band of the receive filter). The energy detected is referenced E. The spectrum is asymmetrical due to this frequency difference.

To estimate the above-mentioned frequency difference, the invention proposes to compare the energy levels detected on either side of the center frequency of the receive filters 16 and 17 (FIG. 1) after subtracting from the energy levels the noise level present in the received spectrum, as described below.

The L summed vectors are delivered to a demultiplexer 25 directing the various points of the spectrum to four modules 26 to 29.

The module 26 computes the energy lying in the lower band of the spectrum of FIG. 3, e.g. lying in the range 0 to $b_1-1$, where $b_1$ is a point situated at a given distance from the center of the spectrum. More precisely, the module 26 computes the following value:

$$\frac{1}{b_1} * \sum_{i=0}^{b_1-1} E_i$$

where $E_i$ represents the energy levels of the points lying in the range 0 to $b_1-1$.

The module 28 computes the energy lying in the upper band of the spectrum of FIG. 3, e.g. the band lying in the range $b_2+1$ to $N-1$, where $b_2$ is a point situated at the same distance from the center of the spectrum as the point $b_1$. More precisely, the module 28 computes the following value:

$$\frac{1}{N-b_2-1} * \sum_{i=b_2+1}^{N-1} E_i$$

where $E_i$ represents the energy levels of the points lying in the range $b_2+1$ to $N-1$.

The module 27 computes the minimum of the points $b_1$ and $b_2$ so as to deliver information on the noise level. In FIG. 3, the noise level is given by the point $b_1$, the point $b_2$ being situated at a higher energy level. In general, the noise is estimated by comparing the points of the spectrum that are situated at about $\pm Ds/5$ from the center frequency. The points $b_1$ and $b_2$ can be obtained by the following relationships:

$$b_1=[(2.N.M/n.K)] \text{ and } b_2=N-b_1$$

The value of n depends on the roll-off of the Nyquist filters used on reception. Typically, such roll-off is about 0.3 or 0.4, and the value of n is 5.

Subtractor means 30, 31 are provided to subtract the noise level given by the module 27 from the energy levels output by the modules 26 and 28. At the outlets of these subtractor means 30, 31, the resulting energy levels shown by hatching in FIG. 3 are respectively obtained. It is thus possible to overcome the problem of the variable noise level recovered in the band of the receive filters.

The invention proposes to compare the resulting energy levels, the difference between them being proportional to the frequency difference to be determined. By way of example, this comparison may be performed as described below.

The resulting energy levels output by the subtractor means 30, 31 are applied to absolute value circuits 32, 33 followed by logarithmic converters 34, 35. The outputs from the logarithmic circuits 34, 35 are applied to a subtractor 36 which delivers the estimate $\epsilon$.

The estimate $\epsilon$ is then delivered to a transcoding table delivering a frequency shift to be effected for each estimate $\epsilon$ to the local oscillator 12 of the receiver (FIG. 1). Any residual frequency shift is then corrected by means of another algorithm making it possible to fine down the correction that is made.

Figure 4:
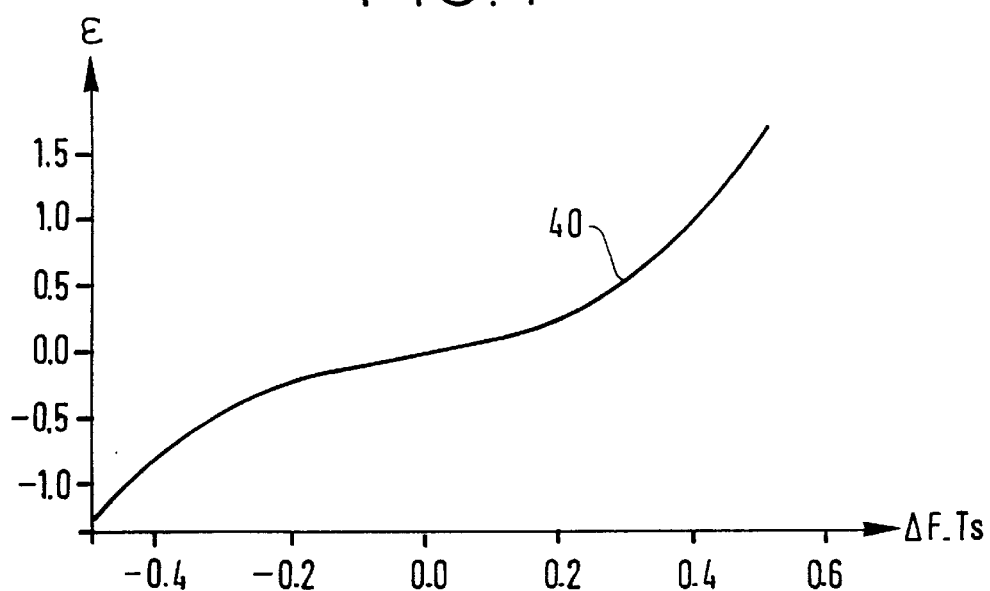
FIG. 4 shows how an estimate $\epsilon$ varies as a function of the frequency difference normalized for symbol time, i.e. ΔF*Ts, in the absence of interference, for N=16 points and L=1000.

FIG. 4 shows how the estimate $\epsilon$ varies as a function of the frequency difference normalized for symbol time, i.e. $\Delta F*Ts$, in the absence of interference, for N=16 points and L=1000.

It can be observed that this characteristic 40 is invariant as a function of the Eb/No ratio in the range −0.5 to +0.5, this range corresponding to the interval [−Ds/2, +Ds/2].

The apparatus of the invention described above thus works for frequency shifts lying in the range $\pm Ds/2$, i.e. in a range twice as wide as that of the Alberty algorithm.

Figure 5:
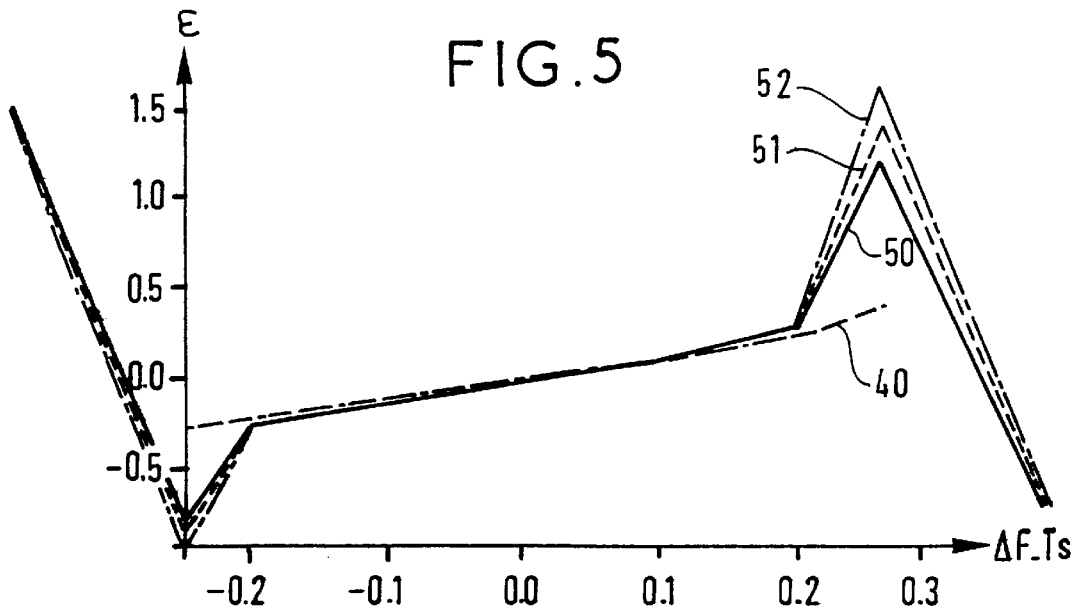
FIG. 5 shows how the estimate $\epsilon$ varies as a function of ΔF*TS, in the presence of interference constituted by two adjacent channels situated on either side at 13 dB beyond the level of the demodulated channel.

FIG. 5 shows how the estimate $\epsilon$ varies in the presence of two adjacent channels situated on either side at 13 dB beyond the level of the demodulated channel (strong interference). By way of comparison, the characteristic 40 corresponding to that of FIG. 4 (no adjacent channels) is also shown. The characteristics 50, 51, and 52 are obtained in the presence of the above-mentioned adjacent channels, respectively for Eb/No equal to 3, 5, and 10. All of the characteristics are obtained for N=16 and L=1000.

It can be observed that regardless of the level of the interference, the estimate $\epsilon$ is reliable for shifts less than Ds/4 ($\Delta F*Ts$ lying in the range $\pm 0.25$). In contrast, a very sharp divergence (sudden change in the sign of the slope) of the estimate $\epsilon$ is obtained as soon as the frequency difference $\Delta F*Ts$ goes beyond these limits. As a result, the frequency correction to be made is ambiguous.

In order to remedy this drawback, the invention proposes also to detect when the frequency difference normalized for symbol time $\Delta F*Ts$ becomes higher than Ds/4. For this purpose, the module 29 compares the energy levels $b_3$ and $b_4$ of FIG. 3 with the midpoint pm of the spectrum received in the band in question. The midpoint pm is that obtained for the FFT of rank 0. It is situated 3 dB below the maximum level for a frequency shift of Ds/2. The points $b_3$ and $b_4$ are typically situated at N/2±2. In practice, the points $b_3$ and $b_4$ are the points of the spectrum that correspond to ±Ds/2 and they are the first points of the spectrum situated below the −3 dB energy levels.

The module 29 instructs the local oscillator of the receiver to effect a shift of +Ds/4 if the energy level of the point $b_3$ is greater than the energy level of the point pm, and to effect a shift of −Ds/4 if the energy level of the point $b_4$ is greater than the energy level of the point pm. If one of the two points has an energy level greater than pm, this means that a portion of the energy of adjacent interference is situated in the band of the Nyquist filters, and that the analysis is shifted by a value greater than or equal to Ds/4. This shift of ±Ds/4 thus makes it possible to re-center the spectrum in the band for which an estimate ε corresponds to one frequency shift ΔF*TS to be effected only (unambiguous characteristic). The module 29 thus constitutes means for detecting a frequency shift greater than Ds/4.

As a function of the frequency shift existing between the carrier frequency of the received signal and the frequency of the local oscillator signal, one or more successive summings of L vectors must be made:

in the absence of interference or for a shift less than ±Ds/4, convergence is immediately obtained after summing L vectors; and in the presence of a shift greater than ±Ds/4, and in the presence of interference, two successive summings of L vectors are necessary, a first one to reposition the spectrum by shifting by ±Ds/4, and a second to enable a reliable estimate ε to be obtained.

The estimation apparatus of the invention is applicable to transmission systems operating on modulations using at least 4 samples per symbol. It lends itself in particular to receiving data transmitted by satellite, and to being implemented using ASIC technology.

What is claimed is:

1. Apparatus for estimating a frequency difference existing between a carrier frequency of a received digital signal, and a frequency of a signal from a local oscillator contained in a receiver of said received signal, said receiver performing quadrature demodulation on said received signal, said apparatus comprising:

noise detector means (27) for detecting a noise level received in receive filter bands (16, 17);

computing means (21, 22) for computing discrete Fourier transforms on the received signal (SR) transposed into baseband (I, Q) and generating vectors corresponding to energy levels detected on either side of center of said receive filter bands (16, 17);

summing means (23–26, 28) for inputting said vectors and outputting smoothed energy levels based on a sum of said detected energy levels;

subtractor means (30, 31) for subtracting said noise level from said smoothed energy levels and outputting resulting energy levels; and comparator means (32 to 36) for comparing the resulting energy levels, thereby delivering an estimate ε of said frequency difference.

2. Apparatus according to claim 1, wherein said comparator means (32 to 36) are means for computing the ratio of the resulting energy levels.

3. Apparatus according to claim 1, further comprising means (29) for detecting a frequency shift greater than Ds/4, where Ds is the symbol rate.

4. Apparatus according to claim 3, wherein said means (29) for detecting a frequency shift greater than Ds/4 compare an energy level of a midpoint (pm) of a spectrum obtained by said computing means (21) based on energy levels of two points ($b_3$, $b_4$) situated immediately below a −3 dB energy level of said spectrum, and cause the frequency of said local oscillator to be shifted by ±Ds/4 when one of said two energy levels ($b_3$, $b_4$) is greater than said energy level of said midpoint (pm).

5. A digital signal receiver, comprising apparatus according to claim 1.

6. Apparatus for estimating a frequency difference existing between the carrier frequency of a received digital signal and the frequency of a signal from a local oscillator contained in a receiver of said received signal, said receiver performing quadrature demodulation on said received signal, said apparatus comprising:

a noise detector operative to detect a noise level received in receive filter bands (16, 17);

a processor operative to compute discrete Fourier transforms on the received signal (SR) transposed into baseband (I, Q), and generate vectors corresponding to energy levels of bands of said receive filter bands;

summing circuitry operative to input said vectors and output corresponding smoothed energy levels;

a subtractor circuit operative to subtract said noise level from said smoothed energy levels and output resulting energy levels; and a comparator operative to compare the resulting energy levels in order to thereby output a signal corresponding to an estimate ε of said frequency difference.

7. Apparatus according to claim 6, wherein said comparator computes the ratio of said resulting energy levels.

8. Apparatus according to claim 6, further including a frequency shift detector that detects a frequency shift greater than Ds/4, where Ds is the symbol rate.

9. Apparatus according to claim 8, wherein said frequency shift detector compares the energy level at a midpoint (pm) of a spectrum obtained by said processor with the energy levels of two points ($b_3$, $b_4$) situated immediately below the −3 dB energy levels of said spectrum, and causes the frequency of said local oscillator to be shifted by ±Ds/4 when one of said two energy levels ($b_3$, $b_4$) is greater than said energy level of said midpoint (pm).

10. A digital signal receiver, comprising apparatus according to any one of claims 6 to 9.

* * * * *